(12) United States Patent  (10) Patent No.: US 7,489,178 B2
Yeung  (45) Date of Patent: Feb. 10, 2009

(54) LEVEL SHIFTER FOR USE BETWEEN VOLTAGE DOMAINS

(75) Inventor: Gus Yeung, Austin, TX (US)

(73) Assignee: ARM Limited, Cambridge (GB)

( * ) Notice: Subject to any disclaimer, the term of this patent is extended or adjusted under 35 U.S.C. 154(b) by 61 days.

(21) Appl. No.: 11/646,582

(22) Filed: Dec. 28, 2006

(65) Prior Publication Data

US 2008/0157848 A1    Jul. 3, 2008

(51) Int. Cl.
*H03L 5/00* (2006.01)
(52) U.S. Cl. .......................... 327/333; 326/63; 326/68; 326/80; 326/81
(58) Field of Classification Search ................. 327/333; 326/63, 68, 80, 81
See application file for complete search history.

(56) References Cited

U.S. PATENT DOCUMENTS

| | | | | |
|---|---|---|---|---|
| 5,399,915 A | * | 3/1995 | Yahata | 327/108 |
| 5,399,920 A | * | 3/1995 | Van Tran | 326/83 |
| 6,307,398 B2 | * | 10/2001 | Merritt et al. | 326/81 |
| 6,445,210 B2 | * | 9/2002 | Nojiri | 326/68 |
| 2005/0127977 A1 | * | 6/2005 | Itoh | 327/333 |

* cited by examiner

*Primary Examiner*—Kenneth B Wells
*Assistant Examiner*—Adam Houston
(74) *Attorney, Agent, or Firm*—Nixon & Vanderhye P.C.

(57) ABSTRACT

A level shifter circuit 28 has a first buffer circuit 30 and a second buffer circuit 32, 34. An intermediate signal generated by the first buffer circuit 30 is directly passed to the second buffer circuit 32, 34 to control output of one of its output signal levels. A feedback signal generated in response to the input signal within the first power domain containing the first buffer circuit 30 is passed directly to the second buffer circuit 32, 34 to control the output signal level reaching the other of the output values. A feedback circuit comprising cross-coupled PMOS transistors 38, 40 is provided to boost the feedback signal level up to the voltage level of the second voltage domain which contains the feedback circuit 38, 40 as well as the second buffer circuit 32, 34. The level shifter circuit 28 has a low latency and a low static power consumption.

22 Claims, 3 Drawing Sheets

US 7,489,178 B2

LEVEL SHIFTER FOR USE BETWEEN VOLTAGE DOMAINS

BACKGROUND OF THE INVENTION

1. Field of the Invention

This invention relates to the field of level shifter circuits for use between voltage domains, such as, for example, different voltage domains within an integrated circuit.

2. Description of the Prior Art

A level shifter circuit is used when there is a need to pass signals from one voltage domain to a different voltage domain. Typically, such multiple domain arrangements were not used in high performance systems due to the increased complexity and the relatively long latency which is associated with level shifter circuits.

A trend within integrated circuits is the increasingly common use of embedded SRAM memory. With the reduction in size of process geometries, such SRAM cells are becoming less stable. In order to enhance the stability of SRAM provided on-chip, and still achieve low power for the processor, there is an increasing need for the SRAM and the processor to use different voltage supplies from different domains. As an example, embedded SRAM may use a higher voltage supply to guarantee state retention whilst the rest of the system including the processor may use a lower voltage supply to reduce power consumption. In order to maintain the performance of the processor, and to reduce switching power, level shifters are provided to pass signals between these domains. These level shifters should have a low latency and a low switching (crow-bar) power. Such level shifters should also have a low circuit area overhead.

FIG. 1 of the accompanying drawings schematically illustrates the basic concept of a level shifter circuit. This comprises a first inverter 2 operating in a low voltage domain and a second inverter 4 operating in a high voltage domain. A problem with this simple arrangement is that the desirable situation of a low static power consumption is difficult to achieve within the second inverter 4 since the signal from the first inverter 2 at the VDD level of the first domain is ineffective at completely switching off the transistors within the second inverter 4 given its higher VDD level. In addition, the current during switching of the second inverter 4 is undesirably high.

FIG. 2 of the accompanying drawings shows a known level shifter seeking to address some of the limitations of the level shifter of FIG. 1. In this level shifter circuit, a feedback PMOS 6 is provided to boost the voltage at node 8 to the value of the HighVDD. This provides a reasonable solution to limiting the power consumption. However, the circuit of FIG. 2 suffers from a limited range of voltage level shifting within which it may operate since the input inverter 10 may not be strong enough to overcome the action of the feedback PMOS 6 if the low voltage domain is operating at a significantly lower VDD level than the high voltage domain. In addition, the operational range of this level shifter circuit depends upon process variation concerning the PMOS to NMOS ratio. Furthermore, the latency of the level shifter circuit can vary significantly based upon the process variation and the range of VDD being switched between.

FIG. 3 illustrates a possible enhancement over the circuit of FIG. 2. In this circuit a pair or cross-coupled PMOS transistors 12, 14 is used to provide a feedback circuit to boost the voltage at node 16 to the HighVDD level when appropriate. When the input to the level shifter circuit 20 is a "1", the NMOS transistor 8 will turn on and in turn force the voltage at node 16 low. This turns on PMOS transistor 14, which turns off PMOS transistor 12 and then drives a high value of "1" out through the inverter 22. When the input to the NMOS transistor 18 is a "0", the inverter 24 will switch its output to a "1", which in turn will switch on the NMOS transistor 26, switch on the PMOS transistor 12, drive the node 16 to the full voltage of the high VDD domain via the PMOS transistor 12 and switch off the PMOS transistor 14. The high voltage level at node 16 will be inverted by the inverter 22 and result in a output value of "0" being drive out from the inverter 22. A significant disadvantage of the circuit of FIG. 3 is that it has a disadvantageously long latency since it is necessary when the input is changed to a "0" for this change to propagate through four levels of transistors, namely through inverter 24, NMOS transistor 26, PMOS transistor 12 and inverter 22.

SUMMARY OF THE INVENTION

Viewed from one aspect the present invention provides a level shifter circuit for receiving an input signal in a first voltage domain and generating an output signal in a second voltage domain, said first voltage domain operating with a first voltage supply providing a first voltage level and a common voltage level and said second voltage domain operating with a second voltage supply providing a second voltage level and said common voltage level, said level shifter circuit comprising:

a first buffer circuit operating in said first voltage domain and responsive to said input signal to generate an intermediate signal having either said first voltage level or said common voltage level;

a second buffer circuit operating in said second voltage domain and responsive to said intermediate signal to generate said output signal having either said second voltage level or said common voltage level; and a feedback circuit operating in said second voltage domain and responsive to a feedback signal driven to said first voltage level by a circuit in said first domain, when said first buffer circuit generates said intermediate signal having said first voltage level, to boost said feedback signal to said second voltage level; wherein said second buffer circuit is coupled to said first buffer circuit so as to directly receive said intermediate signal and to be responsive to said intermediate signal having said common voltage level so as substantially to switch off current flow through said second buffer circuit and to generate an output signal having one of said second voltage level and said common voltage level; and said second buffer circuit is coupled to said feedback circuit so as to receive said feedback signal and to be responsive to said feedback signal boosted to said second voltage level so as substantially to switch off current flow through said second buffer circuit and to generate an output signal having another of said one of said second voltage level and said common voltage level.

The present technique recognises that latency can be reduced by using a first and a second buffer circuit, directly coupling the signals from the first buffer circuit to the second buffer circuit and providing a feedback circuit operating away from the critical path to boost the non-common voltage level signal supplied by the first buffer circuit to the voltage level being used by the second buffer circuit in the second domain and thereby properly switch off the relevant transistors within the second buffer circuit so as to reduce the static power consumption thereof. In this way, the level shifter circuit of the present technique is able to combine reduced latency with low static power consumption.

The level shifter circuit can be provided between different voltage domains which have variable supply voltages, such that sometimes the supply voltages are the same and sometimes they are different. The level shifter circuit provides reduced latency without a dependence upon whether there is a voltage difference.

The feedback circuit can be provided in a number of different ways, but is conveniently provided in the form of cross-coupled transistors.

The circuit within the first domain which drives the feedback signal to the first voltage level can be provided in a number different ways, but is advantageously provided in the form of a feedback signal initiating transistor receiving the input signal in parallel with the first buffer circuit. Placing the feedback signal initiating transistor in parallel with the first buffer circuit means that generation of the feedback signal is rapid with no additional latency consequent to the signal having first to propagate through the first buffer circuit.

Further speed gains may be achieved by the provision of a feedback signal boost transistor operating in the second voltage domain and coupled to the feedback signal initiating circuit and responsive to the intermediate signal to boost the feedback signal to the second voltage level in cooperation with the feedback circuit. This raises the rise time of the feedback circuit and speeds switching.

Whilst the provision of the feedback circuit to boost the feedback signal to the full voltage level in the second domain is advantageous in reducing static power consumption, the action of the feedback circuit will tend to resist changes in the level of the feedback signal, and thereby slow switching operation. In order to help reduce this phenomenon, the feedback circuit is coupled to the second voltage supplied by one or more supply interrupting transistors controlled by the input signal to temporarily interrupt feedback operation of the feedback circuit and thereby reduce the action of the feedback circuit in registering changes in the feedback signal.

Further speed performance increases can be achieved by providing an output signal boost transistor operating in the second voltage domain and coupled to the second buffer circuit that is responsive to the feedback signal to assist the second buffer circuit in driving the output signal to the common voltage level (normally ground when this is necessary.

Whilst it will be appreciated that the first buffer circuit can take a variety of different forms, it is advantageously provided in the form of an inverter. Similarly, the second buffer circuit can have a variety of different forms, but is advantageously provided in the form of a transistor stack having a first stack transistor switched by the feedback signal and a second stack transistor switched by the intermediate signal.

Whilst the present technique can be used in a wide variety of applications, it is particularly useful when the level shifter circuit is part of an integrated circuit and when the second voltage domain includes a memory circuit operating with the second voltage supply so as to enhance data retention within that memory circuit.

Viewed from another aspect the present invention provides a level shifter circuit for receiving an input signal in a first voltage domain and generating an output signal in a second voltage domain, said first voltage domain operating with a first voltage supply providing a first voltage level and a common voltage level and said second voltage domain operating with a second voltage supply providing a second voltage level and said common voltage level, said level shifter circuit comprising:

a first circuit operating in said first voltage domain and responsive to said input signal to generate one or more intermediate signals having either said first voltage level or said common voltage level;

a second circuit operating in said second voltage domain and responsive to said one or more intermediate signals to generate said output signal having either said second voltage level or said common voltage level; wherein said second circuit is coupled to said first circuit so as to directly receive a first of said one or more intermediate signals and to be responsive to said first of said one or more intermediate signals having said common voltage level so as substantially to switch off current flow through said second circuit and to generate an output signal having one of said second voltage level and said common voltage level; and further comprising a boost circuit operating in said second voltage domain and responsive to a second of said one or more intermediate signals having said first voltage level to boost a second of said one or more intermediate signals to said second voltage level; wherein said second circuit is coupled to said first circuit so as to directly receive said second of said one or more intermediate signals and to be responsive to said second of said one or more intermediate signals having said second voltage level so as substantially to switch off current flow through said second circuit and to generate an output signal having an other one of said second voltage level and said common voltage level.

Viewed from a further aspect the present invention provides a level shifter circuit for receiving an input signal in a first voltage domain and generating an output signal in a second voltage domain, said first voltage domain operating with a first voltage supply providing a first voltage level and a common voltage level and said second voltage domain operating with a second voltage supply providing a second voltage level and said common voltage level, said level shifter circuit comprising:

a first buffer means for operating in said first voltage domain and responsive to said input signal to generate an intermediate signal having either said first voltage level or said common voltage level;

a second buffer means for operating in said second voltage domain and responsive to said intermediate signal to generate said output signal having either said second voltage level or said common voltage level; and a feedback means for operating in said second voltage domain and responsive to a feedback signal driven to said first voltage level by circuit means in said first domain, when said first buffer means generates said intermediate signal having said first voltage level, to boost said feedback signal to said second voltage level; wherein said second buffer means is coupled to said first buffer circuit so as to directly receive said intermediate signal and to be responsive to said intermediate signal having said common voltage level so as substantially to switch off current flow through said second buffer means and to generate an output signal having one of said second voltage level and said common voltage level; and said second buffer means is coupled to said feedback circuit so as to receive said feedback signal and to be responsive to said feedback signal boosted to said second voltage level so as substantially to switch off current flow through said second buffer means and to generate an output signal having another of said one of said second voltage level and said common voltage level.

Viewed from a further aspect the present invention provides a method of level shifting an input signal in a first voltage domain to generating an output signal in a second voltage domain, said first voltage domain operating with a first voltage supply providing a first voltage level and a common voltage level and said second voltage domain operating with a second voltage supply providing a second voltage level and said common voltage level, said method comprising the steps of:

operating a first buffer circuit in said first voltage domain to respond to said input signal to generate an intermediate signal having either said first voltage level or said common voltage level;

operating a second buffer circuit in said second voltage domain to respond to said intermediate signal to generate said output signal having either said second voltage level or said common voltage level; and operating a feedback circuit in said second voltage domain to respond to a feedback signal driven to said first voltage level by a circuit in said first domain, when said first buffer circuit generates said intermediate signal having said first voltage level, to boost said feedback signal to said second voltage level; wherein said second buffer circuit is coupled to said first buffer circuit so as to directly receive said intermediate signal and to be responsive to said intermediate signal having said common voltage level so as substantially to switch off current flow through said second buffer circuit and to generate an output signal having one of said second voltage level and said common voltage level; and said second buffer circuit is coupled to said feedback circuit so as to receive said feedback signal and to be responsive to said feedback signal boosted to said second voltage level so as substantially to switch off current flow through said second buffer circuit and to generate an output signal having another of said one of said second voltage level and said common voltage level.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 4:
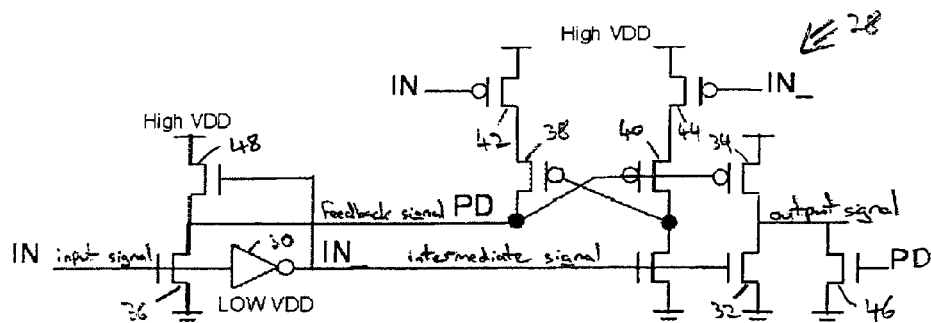
FIG. 4 schematically illustrates a level shifter circuit in accordance with one example embodiment of the present invention.

FIG. 4 shows a level shifter circuit 28 comprising a first buffer circuit in the form of an inverter 30 and a second buffer circuit in the form of a transistor stack comprising transistors 32 and 34. An input signal is applied in parallel to the inputs of an NMOS transistor 36 and the inverter 30. The NMOS transistor 36 serves as a feedback signal initiating transistor. Cross-coupled PMOS transistors 38 and 40 serve as a feedback circuit. Supply interrupting transistors 42 and 44 serve to temporarily interrupt the power supply to the cross-coupled PMOS transistors 38 and 40 in response to the input signal and the inverted input signal respectively, and output boost transistor 46, comprising an NMOS transistor switched by the feedback signal, is coupled to the NMOS transistor 32 of the second buffer circuit and serves to increase the speed at which the output signal falls to a "0" (ground/common voltage level) when the input signal is changed from a "1" to a "0".

Figure 2:
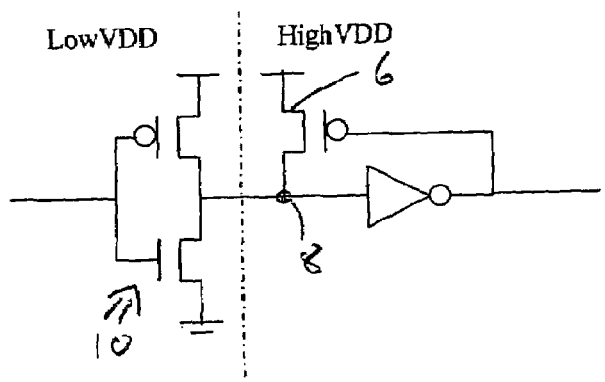
FIG. 2 schematically illustrates a known level shifter circuit incorporating a feedback transistor.
Figure 3:
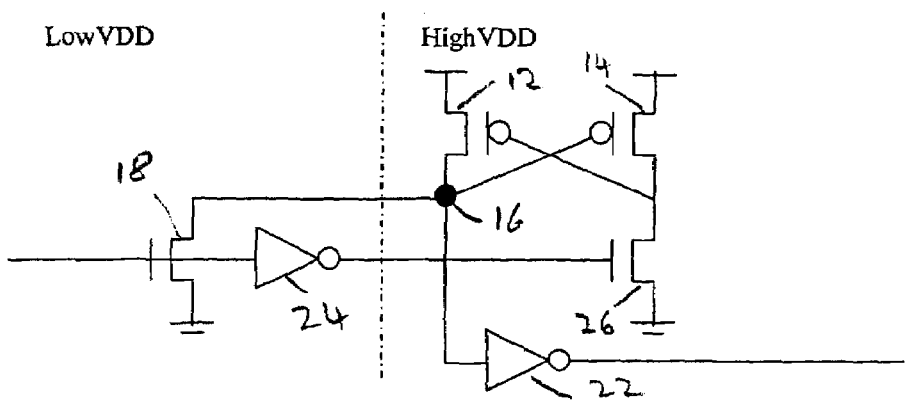
FIG. 3 schematically illustrates one possible level shifter circuit with reduced static power consumption.

Within the circuit illustrated in FIG. 4, the signal initiating transistor 36 and the transistors forming the inverter 30 are part of the first voltage domain driven by the Low VDD supply voltage and ground. All the remaining transistors illustrated in FIG. 2 are part of the second voltage domain and are supplied by the second voltage supply, namely High VDD and ground.

A feedback signal boost transistor 48 is provided supplied by the second voltage domain (High VDD), even though it is more closely associated with the first part of the level shifter circuit, namely the feedback signal initiating transistor 36 and the inverter 30. The feedback signal boost transistor 48 serves in response to the intermediate signal output from the inverter 30 becoming high to switch on and assist in driving the feedback signal up to the HighVDD level in cooperation with the feedback circuit 36, 38.

FIGS. 5, 6, 7 and 8 illustrate the two steady states of the circuit of FIG. 4 and the two possible transitions, namely low to high and high to low.

Figure 1:
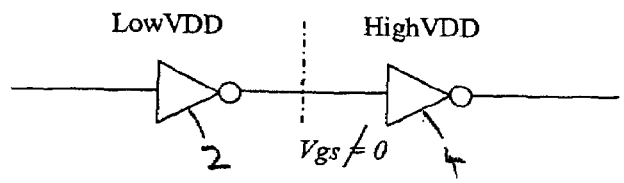
FIG. 1 schematically illustrates the principle of operation of a level shifter circuit.

In FIG. 1, the steady state is illustrated where the input signal is "1" and the output signal is "1". The input signal "1" level is represented by a LowVDD input voltage, whereas the output "1" level is represented by a HighVDD output voltage. This is the action of the level shifter circuit 28. The status of the various transistors illustrated in FIG. 5 in this steady state is shown as either conductive, as indicated by a tick, or non-conductive, as indicated by a cross. It will be seen that the output from the inverter 30 is directly connected to the gate of the transistor 32. Similarly, the feedback signal generated by the feedback signal initiating transistor 36 is directly connected to the gate of the transistor 34. Thus, the number of transistors the input signal has to propagate through to control the circuit elements driving the output signal is advantageously low. It will be seen that the PMOS transistor 38 is serving to isolate the feedback signal from the HighVDD signal of the second (high) voltage domain and accordingly allow the feedback signal to discharge to the common voltage level (ground) through the transistor 36.

Figure 5:
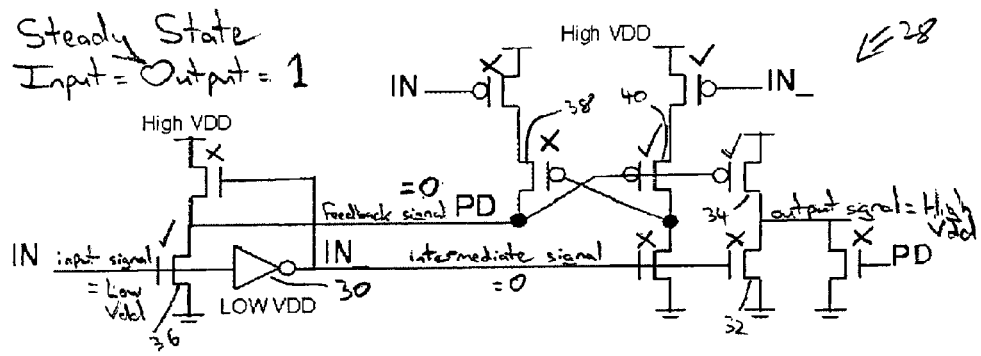
FIGS. 5, 6, 7 and 8 schematically illustrate the circuit of FIG. 4 in a sequence of states.
Figure 6:
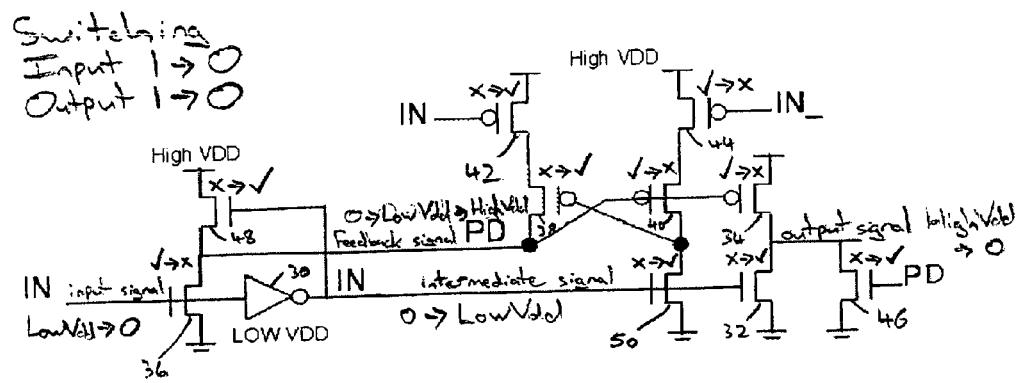

Moving from FIG. 5 to the situation shown in FIG. 6 in which the input signal transitions from "1" to "0", it will be seen that the various transistors all change state from conductive to non-conductive and non-conductive to conductive. Of particular note is the feedback signal driving node PD. When the feedback signal initiating circuit 36 becomes non-conductive, as the input signal becomes low, the output of the inverter 30 becomes high and the feedback signal boost transistor 48 becomes conductive thereby pulling up the feedback signal voltage level first through the LowVDD level and then up to the HighVDD level. The transition in the intermediate signal IN_to the LowVDD level turns off the interrupting transistor 44, which helps prevent the cross-coupled PMOS transistors 38, 40 resisting the change in the feedback signal. As the intermediate signal IN_reaches the LowVDD level, the transistor 50 becomes conductive at the same time as the PMOS transistor 40 is becoming non-conductive, so pulling the gate of the PMOS transistor 38 low and turning on this transistor at the same time as the interrupting transistor 42 is also turning on in a manner which helps pull up the voltage level of the node PD towards the HighVDD level and hold it at this level.

In the second buffer circuit comprising the stack of transistors 32 and 34, the transistor 32 becomes conductive as it is switched at its gate by the LowVDD signal, which is directly supplied to it from the inverter 30. This drives the output signal towards the ground signal level "0". This is further assisted by the action of the output boost transistor 46, which also becomes conductive under the influence of the signal at the PD node, which is coupled to the gate of this transistor and helps to draw the output signal level down to ground.

Figure 7:
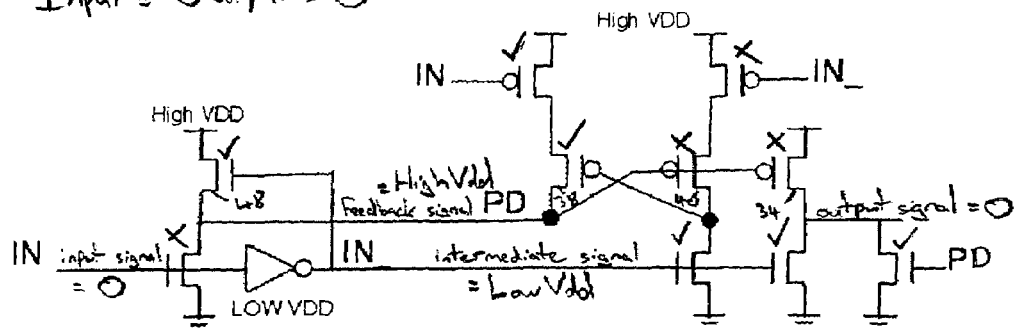

FIG. 7 illustrates the steady state in which the input and output signal are both "0". It should be noted that in this state that the transistors 40 and 34 are both fully switched off by the action of the feedback signal, which has been drawn up to the HighVDD level. This is significant as it reduces the static power consumption of the level shifter circuit by reducing the otherwise significant static leakage current. The combined actions of the feedback transistors 38 and 40, together with the feedback signal boost transistor 48, serve to draw the feedback signal at the node PD fully up to the HighVDD level in order to assist in achieving this advantageously low static power consumption. Nevertheless, the feedback signal is directly connected to the gate of the transistor 34 of the second buffer circuit and is able to control the output signal level with reduced latency.

Figure 8:
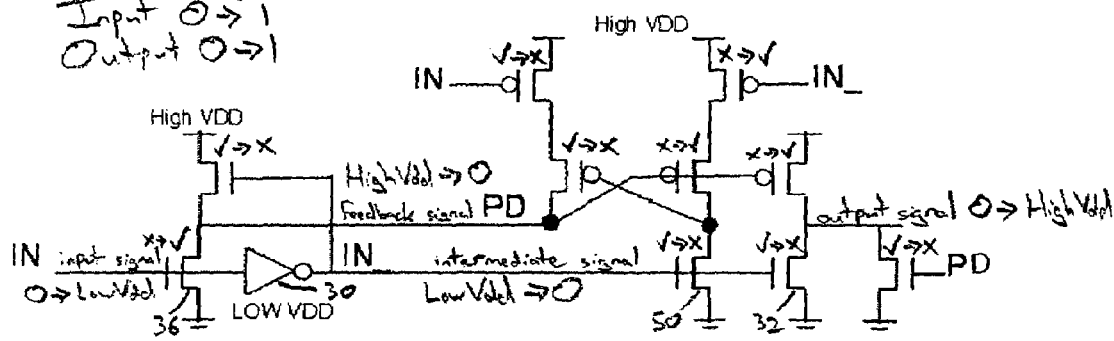

FIG. 8 illustrates the transition of the input and output signals from a "0" to a "1". The transitions of the various transistors from conductive to non-conductive and non-conductive to conductive are illustrated. It will be seen that the transition of the feedback signal and the intermediate signal towards the common voltage level proceeds by a discharge of the feedback signal through the transistor 36 and a discharge of the intermediate signal through the inverter 30. Since the common voltage level (ground) is shared by both the first voltage domain (low) and the second voltage domain (high), then the transistors 32 and 50 are both fully switched off resulting in a low static power consumption.

Figure 9:
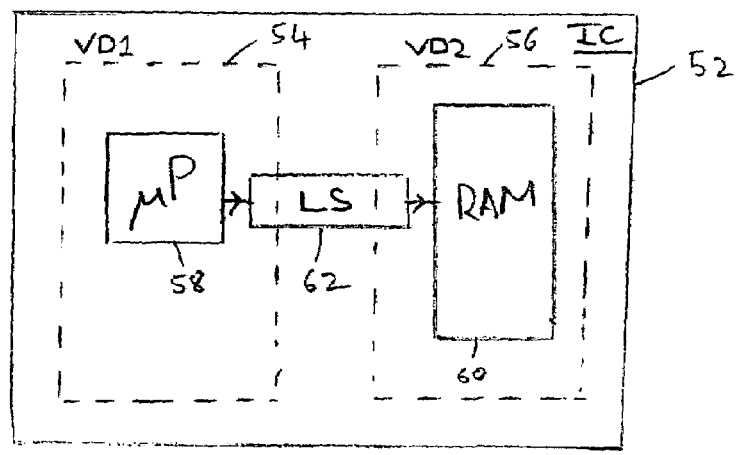
FIG. 9 schematically illustrates an integrated circuit using the present techniques.

FIG. 9 schematically illustrates an integrated circuit 52 incorporating a first voltage domain 54 and a second voltage domain 56. A microprocessor 58 executing program instructions is disposed within the first voltage domain 54. A memory 60 storing data values (possibly in SRAM cells) is disposed within the second voltage domain 56. A level shifter circuit 62 is used to pass a signal from the first voltage domain 54 to the second voltage domain 56. The first voltage domain 54 is a low voltage domain aimed at producing a low power consumption as a consequence of the switching activities within the microprocessor 58. The second voltage domain 56 is a high voltage domain aimed at ensuring proper signal retention within the SRAM cells of the memory 60. The level shifter circuit 62 formed in accordance with the embodiment illustrated in FIG. 4 serves to couple a signal from the first domain 54 to the second domain 56 with a low latency and with a low static power consumption.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A level shifter circuit for receiving an input signal in a first voltage domain and generating an output signal in a second voltage domain, said first voltage domain operating with a first voltage supply providing a first voltage level and a common voltage level and said second voltage domain operating with a second voltage supply providing a second voltage level and said common voltage level, said level shifter circuit comprising:

a first buffer circuit operating in said first voltage domain and responsive to said input signal to generate an intermediate signal having either said first voltage level or said common voltage level;

a second buffer circuit operating in said second voltage domain and responsive to said intermediate signal to generate said output signal having either said second voltage level or said common voltage level; and a feedback circuit operating in said second voltage domain and responsive to a feedback signal driven to said first voltage level by a circuit in said first domain, when said first buffer circuit generates said intermediate signal having said first voltage level, to boost said feedback signal to said second voltage level; wherein said second buffer circuit is coupled to said first buffer circuit so as to directly receive said intermediate signal and to be responsive to said intermediate signal having said common voltage level so as substantially to switch off current flow through said second buffer circuit and to generate an output signal having one of said second voltage level and said common voltage level;

said second buffer circuit is coupled to said feedback circuit so as to receive said feedback signal and to be responsive to said feedback signal boosted to said second voltage level so as substantially to switch off current flow through said second buffer circuit and to generate an output signal having another of said one of said second voltage level and said common voltage level, and said feedback circuit is coupled to said second voltage supply by one or more supply interrupting transistors controlled by said input signal to temporarily interrupt feedback operation of said feedback circuit an thereby reduce said feedback circuit resisting changes in said feedback signal as driven by said circuit in said first domain driving said feedback signal.

2. A level shifter circuit as claimed in claim 1, wherein a difference between said first voltage level and said common voltage level being less than a difference between said second voltage level and said common voltage level.

3. A level shifter circuit as claimed in claim 1, wherein said feedback circuit comprises cross-coupled transistors.

4. A level shifter circuit as claimed in claim 1, wherein said circuit in said first domain driving said feedback signal to said first voltage level includes a feedback signal initiating transistor receiving said input signal in parallel with said first buffer circuit.

5. A level shifter circuit as claimed in claim 4, comprising a feedback signal boost transistor operating in said second voltage domain and coupled to said feedback signal initiating transistor, said feedback signal boost transistor being responsive to said intermediate signal to boost said feedback signal to said second voltage level in cooperation with said feedback circuit.

6. A level shifter circuit as claimed in claim 1, wherein said first buffer circuit is an inverter and said intermediate signal is an inverted form of said input signal.

7. A level shifter circuit as claimed in claim 1, wherein said second buffer circuit is a transistor stack having a first stack transistor switched by said feedback signal and a second stack transistor switched by said intermediate signal.

8. A level shifter circuit as claimed in claim 1, wherein said level shifter circuit is part of an integrated circuit.

9. A level shifter circuit as claimed in claim 1, wherein said second voltage domain includes a memory circuit operating with said second voltage supply to enhance data retention within said memory circuit.

10. A level shifter circuit for receiving an input signal in a first voltage domain and generating an output signal in a second voltage domain, said first voltage domain operating with a first voltage supply providing a first voltage level and a common voltage level and said second voltage domain operating with a second voltage supply providing a second voltage level and said common voltage level, said level shifter circuit comprising:
  a first circuit operating in said first voltage domain and responsive to said input signal to generate one or more intermediate signals having either said first voltage level or said common voltage level;
  a second circuit operating in said second voltage domain and responsive to said one or more intermediate signals to generate said output signal having either said second voltage level or said common voltage level; wherein
  said second circuit is coupled to said first circuit so as to directly receive a first of said one or more intermediate signals and to be responsive to said first of said one or more intermediate signals having said common voltage level so as substantially to switch off current flow through said second circuit and to generate an output signal having one of said second voltage level and said common voltage level; and further comprising
  a boost circuit operating in said second voltage domain and responsive to a second of said one or more intermediate signals having said first voltage level to boost a second of said one or more intermediate signals to said second voltage level; wherein
  said second circuit is coupled to said first circuit so as to directly receive said second of said one or more intermediate signals and to be responsive to said second of said one or more intermediate signals having said second voltage level so as substantially to switch off current flow through said second circuit and to generate an output signal having an other one of said second voltage level and said common voltage level; and
  said boost circuit is coupled to said second voltage supply by one or more supply interrupting transistors controlled by said input signal to temporarily interrupt feedback operation of said boost circuit an thereby reduce said boost circuit resisting changes in said feedback signal as driven by said first circuit.

11. A level shifter circuit as claimed in claim 10, wherein a difference between said first voltage level and said common voltage level being less than a difference between said second voltage level and said common voltage level.

12. A level shifter circuit as claimed in claim 10, wherein said boost circuit comprises cross-coupled transistors.

13. A level shifter circuit as claimed in claim 10, wherein said first circuit includes a feedback signal initiating transistor receiving said input signal and driving a feedback signal to said first voltage level, said feedback signal being said second of said one or more intermediate signals.

14. A level shifter circuit as claimed in claim 13, comprising a feedback signal boost transistor operating in said second voltage domain and coupled to said feedback signal initiating transistor, said feedback signal boost transistor being responsive to said first of said one or more intermediate signals to boost said feedback signal to said second voltage level in cooperation with said boost circuit.

15. A level shifter circuit as claimed in claim 10, wherein said first circuit is an inverter and said first of said one or more intermediate signals is an inverted form of said input signal.

16. A level shifter circuit as claimed in claim 10, wherein said second circuit is a transistor stack having a first stack transistor switched by said second of said one or more intermediate signals and a second stack transistor switched by said first of said one or more intermediate signals.

17. A level shifter circuit as claimed in claim 10, wherein said level shifter circuit is part of an integrated circuit.

18. A level shifter circuit as claimed in claim 10, wherein said second voltage domain includes a memory circuit operating with said second voltage supply to enhance data retention within said memory circuit.

19. A level shifter circuit for receiving an input signal in a first voltage domain and generating an output signal in a second voltage domain, said first voltage domain operating with a first voltage supply providing a first voltage level and a common voltage level and said second voltage domain operating with a second voltage supply providing a second voltage level and said common voltage level, said level shifter circuit comprising:
  a first buffer means for operating in said first voltage domain and responsive to said input signal to generate an intermediate signal having either said first voltage level or said common voltage level;
  a second buffer means for operating in said second voltage domain and responsive to said intermediate signal to generate said output signal having either said second voltage level or said common voltage level; and
  a feedback means for operating in said second voltage domain and responsive to a feedback signal driven to said first voltage level by circuit means in said first domain, when said first buffer means generates said intermediate signal having said first voltage level, to boost said feedback signal to said second voltage level; wherein
  said second buffer means is coupled to said first buffer circuit so as to directly receive said intermediate signal and to be responsive to said intermediate signal having said common voltage level so as substantially to switch off current flow through said second buffer means and to generate an output signal having one of said second voltage level and said common voltage level;
  said second buffer means is coupled to said feedback circuit so as to receive said feedback signal and to be responsive to said feedback signal boosted to said second voltage level so as substantially to switch off current flow through said second buffer means and to generate an output signal having another of said one of said second voltage level and said common voltage level; and
  said feedback means is coupled to said second voltage supply by one or more supply interrupting transistors controlled by said input signal to temporarily interrupt feedback operation of said feedback means and thereby reduce said feedback means resisting changes in said feedback signal as driven by said circuit means in said first domain driving said feedback signal.

20. A method of level shifting an input signal in a first voltage domain to generating an output signal in a second voltage domain, said first voltage domain operating with a first voltage supply providing a first voltage level and a common voltage level and said second voltage domain operating with a second voltage supply providing a second voltage level and said common voltage level, said method comprising the steps of:

operating a first buffer circuit in said first voltage domain to respond to said input signal to generate an intermediate signal having either said first voltage level or said common voltage level;

operating a second buffer circuit in said second voltage domain to respond to said intermediate signal to generate said output signal having either said second voltage level or said common voltage level; and operating a feedback circuit in said second voltage domain to respond to a feedback signal driven to said first voltage level by a circuit in said first domain, when said first buffer circuit generates said intermediate signal having said first voltage level, to boost said feedback signal to said second voltage level; wherein said second buffer circuit is coupled to said first buffer circuit so as to directly receive said intermediate signal and to be responsive to said intermediate signal having said common voltage level so as substantially to switch off current flow through said second buffer circuit and to generate an output signal having one of said second voltage level and said common voltage level;

said second buffer circuit is coupled to said feedback circuit so as to receive said feedback signal and to be responsive to said feedback signal boosted to said second voltage level so as substantially to switch off current flow through said second buffer circuit and to generate an output signal having another of said one of said second voltage level and said common voltage level, and said feedback circuit is coupled to said second voltage supply by one or more supply interrupting transistors controlled by said input signal to temporarily interrupt feedback operation of said feedback circuit an thereby reduce said feedback circuit resisting changes in said feedback signal as driven by said circuit in said first domain driving said feedback signal.

21. A level shifter circuit for receiving an input signal in a first voltage domain and generating an output signal in a second voltage domain, said first voltage domain operating with a first voltage supply providing a first voltage level and a common voltage level and said second voltage domain operating with a second voltage supply providing a second voltage level and said common voltage level, said level shifter circuit comprising:

a first buffer circuit operating in said first voltage domain and responsive to said input signal to generate an intermediate signal having either said first voltage level or said common voltage level;

a second buffer circuit operating in said second voltage domain and responsive to said intermediate signal to generate said output signal having either said second voltage level or said common voltage level;

a feedback circuit operating in said second voltage domain and responsive to a feedback signal driven to said first voltage level by a circuit in said first domain, when said first buffer circuit generates said intermediate signal having said first voltage level, to boost said feedback signal to said second voltage level; wherein said second buffer circuit is coupled to said first buffer circuit so as to directly receive said intermediate signal and to be responsive to said intermediate signal having said common voltage level so as substantially to switch off current flow through said second buffer circuit and to generate an output signal having one of said second voltage level and said common voltage level;

said second buffer circuit is coupled to said feedback circuit so as to receive said feedback signal and to be responsive to said feedback signal boosted to said second voltage level so as substantially to switch off current flow through said second buffer circuit and to generate an output signal having another of said one of said second voltage level and said common voltage level; and an output signal boost transistor operating in said second voltage domain and coupled to said second buffer circuit, said output signal boost transistor being responsive to said feedback signal to assist said second buffer circuit in driving said output signal to said common voltage level.

22. A level shifter circuit for receiving an input signal in a first voltage domain and generating an output signal in a second voltage domain, said first voltage domain operating with a first voltage supply providing a first voltage level and a common voltage level and said second voltage domain operating with a second voltage supply providing a second voltage level and said common voltage level, said level shifter circuit comprising:

a first circuit operating in said first voltage domain and responsive to said input signal to generate one or more intermediate signals having either said first voltage level or said common voltage level;

a second circuit operating in said second voltage domain and responsive to said one or more intermediate signals to generate said output signal having either said second voltage level or said common voltage level; wherein said second circuit is coupled to said first circuit so as to directly receive a first of said one or more intermediate signals and to be responsive to said first of said one or more intermediate signals having said common voltage level so as substantially to switch off current flow though said second circuit and to generate an output signal having one of said second voltage level and said common voltage level; and further comprising a boost circuit operating in said second voltage domain and responsive to a second of said one or more intermediate signals having said first voltage level to boost a second of said one or more intermediate signals to said second voltage level; wherein said second circuit is coupled to said first circuit so as to directly receive said second of said one or more intermediate signals and to be responsive to said second of said one or more intermediate signals having said second voltage level so as substantially to switch off current flow through said second circuit and to generate an output signal having an other one of said second voltage level and said common voltage level; and an output signal boost transistor operating in said second voltage domain and coupled to said second circuit, said output signal boost transistor being responsive to said second of said one or more intermediate signals to assist said second circuit in driving said output signal to said common voltage level.

* * * * *